(12) United States Patent
Yoshihara

(10) Patent No.: US 8,867,230 B2
(45) Date of Patent: Oct. 21, 2014

(54) STORAGE SYSTEM AND PRINTED CIRCUIT BOARD

(71) Applicant: Hitachi, Ltd., Tokyo (JP)

(72) Inventor: Masatoshi Yoshihara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/111,690

(22) PCT Filed: Jan. 9, 2013

(86) PCT No.: PCT/JP2013/050182
§ 371 (c)(1),
(2), (4) Date: Oct. 14, 2013

(87) PCT Pub. No.: WO2014/109010
PCT Pub. Date: Jul. 17, 2014

(65) Prior Publication Data
US 2014/0192477 A1 Jul. 10, 2014

(51) Int. Cl.
H05K 1/11 (2006.01)
H05K 1/02 (2006.01)
H05K 1/14 (2006.01)
H05K 1/00 (2006.01)
H05K 1/18 (2006.01)
H05K 7/00 (2006.01)

(52) U.S. Cl.
CPC .................................. *H05K 1/0251* (2013.01)
USPC ........... 361/784; 361/748; 361/760; 361/764; 361/785; 361/788

(58) Field of Classification Search
USPC ......... 361/748, 760, 761, 764, 777, 784, 785, 361/788; 174/250, 251
See application file for complete search history.

(56) References Cited

U.S. PATENT DOCUMENTS 6,639,487 B1 * 10/2003 Salmela et al. ................. 333/34
2006/0197625 A1 9/2006 Kashiwakura
2007/0130555 A1 * 6/2007 Osaka ............................ 716/15

FOREIGN PATENT DOCUMENTS

| JP | 2002-536904 A | 10/2002 |
| JP | 2004-014800 A | 1/2004 |
| JP | 2005-277028 A | 10/2005 |
| JP | 2006-245291 A | 9/2006 |

* cited by examiner

Primary Examiner — Hoa C Nguyen
Assistant Examiner — Binh Tran
(74) Attorney, Agent, or Firm — Volpe and Koenig, P.C.

(57) ABSTRACT

In the present invention, generation of occurrence of a wiring area is prevented, and a reflection by an inconsistency of a characteristic impedance of a high-speed signal line and a through hole connecting portion. By doing so, a conductor pattern of a raised shape is formed on each of front and back of a through hole, on a GND layer closest to the high-speed signal line in the vicinity of the connecting portion of the high-speed signal line and the through hole. Further, the conductor pattern is a trapezoidal shape, and is a shape which becomes wider as it becomes closer to the through hole.

9 Claims, 14 Drawing Sheets (a) BOARD CROSS-SECTIONAL VIEW (b) GND CONDUCTOR PATTERN (LOOKING DOWN FROM UPPER DIRECTION)

(c) DIFFERENTIAL WIRING (SURFACE LAYER) BOARD CROSS-SECTIONAL VIEW, LEFT SIDE VIEW (DIRECTION A)

(a) CHARACTERISTIC IMPEDANCE (b) COEFFICIENT OF REFLECTION

POINT Am

POINT As

(a) BOARD CROSS-SECTIONAL VIEW (b) GND CONDUCTOR PATTERN (c) BOARD CROSS-SECTIONAL VIEW

STORAGE SYSTEM AND PRINTED CIRCUIT BOARD

TECHNICAL FIELD

The present invention relates to a storage system and a printed circuit board used in the storage system.

BACKGROUND ART

In a high-speed serial interface adopted in a back end of a storage system, such as a SAS (Serial Attached SCSI) or a PCI-express (registered trademark, hereinafter referred to as PCIe), speeding-up of a data communication by speeding-up of a transfer speed, and configuring one logical transmission line by collecting a plurality of input/output ports such as a multi-lane or a multi-link.

Such high-speed serial interface is a method which flows a differential signal corresponding to encoded data, on a signal transmission path generally taking two lines as one pair. Further, in an evaluation of a signal quality of such high-speed wiring, a method of measuring an eye pattern of an overlap of the differential signal, which is displayed on a display of a signal measurement instrument, is used. Generally, it is desirous that an opening area of the eye pattern is large, and a cross point of the differential signal is positioned at an intermediate potential of both signals. As one method of forming the signal transmission path and wiring of the differential signal, there is disclosed a technique of Patent Document 1.

CITATION LIST

Patent Literature

[PTL 1]
Japanese Patent Application Laid-open No. 2006-245291
(US Patent Application Publication No. 2006/0197625)

SUMMARY OF INVENTION

Technical Problem

Generally, it is desirous not to provide a through hole via (hereinafter referred to as a through hole) wiring on a high-speed signal line on a printed circuit board (P/K). This is because a characteristic impedance of the through hole portion and a wiring portion differs, so that a reflection of a signal due to inconsistency of the characteristic impedance is generated at a connection portion of the two, and a noise from superimposing of the reflected signal initiates a signal read error at a receiving end.

On the other hand, a multiplication of input/output ports in a memory device such as a HDD (Hard Disk Drive) and a SSD (Solid State Drive) that are mounted in numerous numbers in a storage system significantly increases the number of data transfer path on the printed circuit board at a back end of the storage system.

Especially, this generates a situation of an increase/growth in density of a number of pins in a LSI (Large Scale Integration) such as a controller and an expander (intermediate switch) which controls the interface, which becomes a cause of significantly lowering a freedom of a signal wiring layout in the vicinity of a product having these important functions.

Therefore, in order to secure the freedom of signal wiring design, even in the high-speed signal route, for example more than few GHz, it is necessary to provide a through hole connection on the printed circuit board, and it is an important technical problem to restrain the reflection from the inconsistency of the characteristic impedance at the through hole connecting portion.

Moreover, an interface adopted for the back end of the storage system is, in contrast to a general TCP/IP network, does not permit frame loss or loss of frame sequence, so that it does not have a resending mechanism for a corrupted packet (frame) only. As such, there is a particular problem that, of a plurality of the frames transferred in one data transfer connection, even if an unrecoverable read error is generated for one specific frame, a retry of resending all the frames of corresponding data transfer becomes necessary, so that needless consumption of a transfer band or an impaired responsiveness caused by the data resending occurs.

Therefore, in the technique disclosed in Patent Document 1, a method of decreasing the inconsistency of the characteristic impedance by providing wiring on the printed circuit board so as to widen a wiring width and a wiring interval of the high-speed transmission path in a stepwise manner.

However, in the conventional method, area necessary for the wiring is drastically increased in the case where a large number of the differential wirings exist, and the conventional art cannot be applied to a region where a high-density wiring is necessary, such as an interface controller o an expander LSI. Further, in the conventional art, there is a problem that a deficiency of the wiring area is likely to occur. In the case where the wiring area becomes deficient, an addition of the wiring layer of the printed circuit board is generated, so that there is a problem that the cost of the printed circuit board and the cost of the system both increase by the increase in the number of board layers.

Therefore, present invention aims at preventing an occurrence of a deficiency of a wiring area, and to reduce a reflection by an inconsistency of characteristic impedance of a high-speed signal path and a through hole connecting portion.

Means for Solving the Problem

In order to solve the above-mentioned problem, in the present invention, a conductor structure (pattern) of a raised shape is formed on a GND layer closest to a signal wiring, at a region in a vicinity of a connecting portion of the signal wiring and a through hole. The conductor pattern is of an isosceles trapezoidal shape and which becomes wider as it becomes closer the through hole, or a stepwise shape which becomes thicker as it becomes closer to the through hole. Further, the conductor pattern is formed in an identical shape at a front and back of the through hole.

Advantageous Effects of Invention

The present is capable of making a steep change of the characteristic impedance generated at the connecting portion of the signal wiring and the through hole gradual, without changing the shape of the wiring pattern, and resolving the inconsistency of the characteristic impedance, so that high-density wiring and mounting is made possible. The problems, configuration and effect other than those explained above will be made apparent from the explanation of the embodiments herein below.

DESCRIPTION OF EMBODIMENTS

Figure 1:
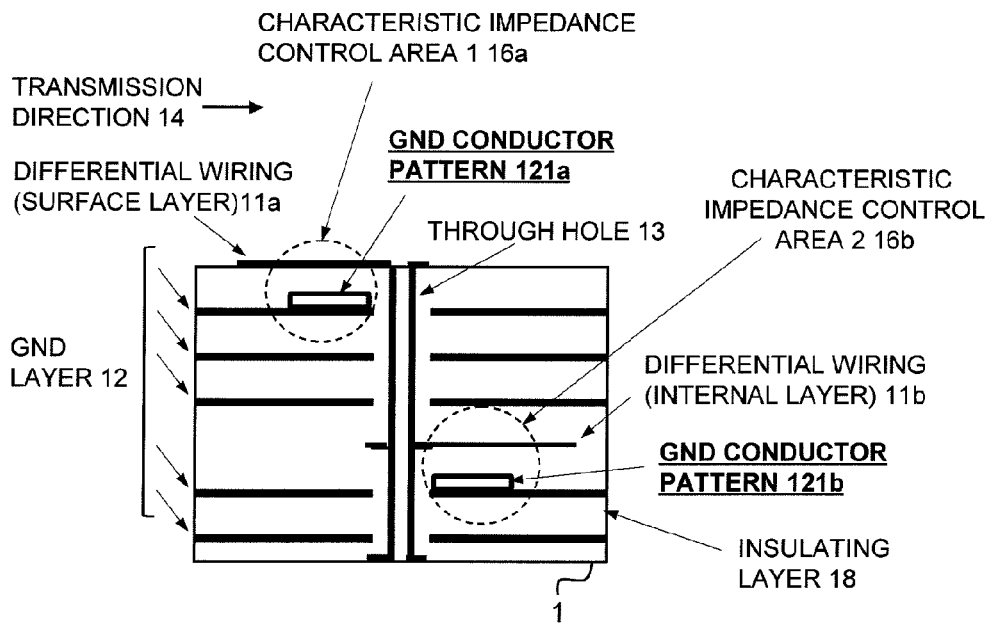
FIG. 1 is a cross-sectional view of a printed circuit board applied with the present invention.

Hereinafter, an embodiment of the present invention will be explained with reference to the drawings.

Further, each element, for example a controller may be identified by a number or the like, other types of identification information, such as a name, may be used, as long as it is an information capable of identifying the element. In the drawings and the explanation of the present invention, identical portion is allotted with identical reference. However, the present invention is not limited to the present embodiment, and every application coinciding with the thought of the present invention is included in the technical range of the present invention. Further, unless otherwise limited specifically, each constituent element may be singular or plural.

<Invention Concept>

Figure 2:
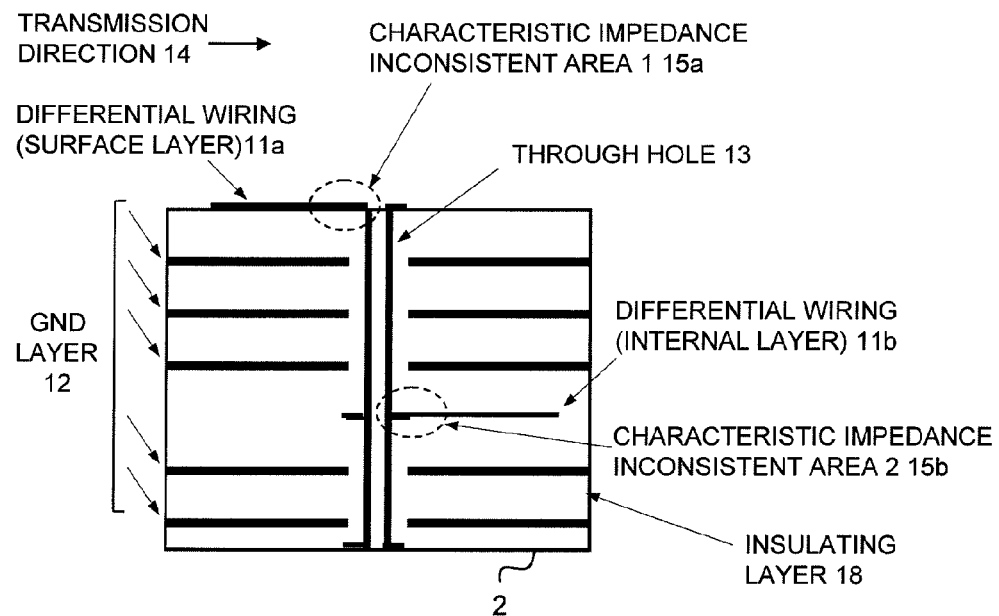
FIG. 2 is a cross-sectional view of a printed circuit board of a conventional art.

A general outline of the present invention will be explained with reference to FIG. 1 and FIG. 2, by comparing with the conventional art. FIG. 1 is a cross-sectional view of a printed circuit board applied with the present invention. FIG. 2 is a cross-sectional view of a printed circuit board of the conventional art.

The printed circuit board according to the embodiment of the present invention is characterized in that a conductor structure (pattern) of a raised shape such as an isosceles trapezoid is formed, at a region in the vicinity of a connecting portion of a differential signal wiring (hereinafter referred to as a differential wiring) and a through hole, on a GND layer closest to the differential wiring, so that the pattern becomes wider as it becomes closer to the through hole.

First, explanation will be given on the conventional art with reference to FIG. 2. In an information system such as a storage system and a server, or in a communication device such as a multifunctional cellular phone, a multi-layered printed circuit board is being used. On a surface layer (a surface and a rear surface) of a printed circuit board 2, a differential wiring (surface layer) 11a (a micro strip line) is formed. Further, to an internal layer of the printed circuit board 2, a differential wiring (internal layer) 11b (strip line) and a GND layer 12 are formed. The differential wiring (surface layer) 11a and the differential wiring (internal layer) 11b are connected by a through hole 13. Although not shown, a power layer is formed in the internal layer. Further, the differential wiring (surface layer) 11a and the differential wiring (internal layer) 11b are sometimes referred to as a differential wiring 11.

Further a material of a typical printed circuit board used in the information system such as the storage system is a glass epoxy resin having a relative permittivity εr, and this material is formed between each layer as an insulating layer so as to maintain an insulated state between a wiring layer and the power layer and the GND layer. Further, a total layer number is approximately 16 layers to 30 layers, with a signal layer of 6 layers to 12 layers, and a total of 10 layers to 18 layers for the power layer and the GND layer 12. Further, generally, the power layer is formed in a pattern, and the GND layer 12 is formed in a uniform solid layer. As is explained above, the differential wiring (surface layer) 11a and the differential wiring (internal layer) 11b are connected by the through hole 13. In the case where a signal from the differential wiring 11 to the through hole 13 is transmitted, a coefficient of reflection at the connecting portion of the differential wiring 11 and the through hole 13 is calculated by the following equation (1).

[Equation 1]

$$\rho = \frac{Zth - Zo}{Zth + Zo} \quad \text{Equation (1)}$$

Where Zo is a characteristic impedance (Ω) of the differential wiring, and Zth is a characteristic impedance (Ω) of the through hole.

As is apparent from Equation (1), it indicates a magnitude of reflection at the connecting portion in the case where transmission line differing in the characteristic impedance is connected, and the reflection increases as ρ (absolute value) increases, and no reflection is generated when the same is 0. That is, it is apparent that a condition for removing the reflection is to make Zo and Zth equal. Further, in order to reduce the reflection, it is necessary to reduce a characteristic impedance difference between the differential wiring and the through hole.

It is preferable to design the wiring, so that the characteristic impedance at a transmission line of a high-speed differential signal such as a PCIe interface (hereinafter referred to as PCIe I/F), a SAS interface (hereinafter referred to as SAS I/F) and the like, becomes a value provided in a standard (generally, 50Ω in a single end, and 100Ω in a differential end).

However, there is the characteristic impedance difference (Zo>Zth) in the differential wiring (surface layer) 11a or the differential wiring (internal layer) 11b and the through hole 13 of the transmission line, and this is called an inconsistency of the characteristic impedance. An area in which the characteristic impedance difference becomes inconsistent is, as is shown in the printed circuit board 2 in FIG. 2, a characteristic impedance inconsistent area 1 15a which is a connecting area of the differential wiring (surface layer) 11a and the through hole 13, and a characteristic impedance inconsistent area 2 15b which is a connecting area of the differential wiring (internal layer) 11b and the through hole 13. The characteristic impedance inconsistent area 1 15a and the characteristic impedance inconsistent area 2 15b are sometimes referred to as a characteristic impedance inconsistent area 15.

In the characteristic impedance inconsistent area 15, the coefficient of reflection ρ becomes larger, and the reflection is generated at the connecting portion of the differential wiring 11 and the through hole 13. A noise by superimposing of reflected signal induces a signal read error at a signal receiving end, and generates a serious failure such as a system down or a data lost in the information system such as the storage system.

Therefore, in a printed circuit board 1 of the present invention, as is shown in FIG. 1, a GND conductor structure (pattern) of a raised shape is formed in a region in the vicinity of the connecting portion of the differential wiring and the through hole (a characteristic impedance control area 1 16a, a characteristic impedance control area 2 16b), on the GND layer 12 closest to the differential wiring 11. The conductor pattern is, for example a trapezoid shape, and is a shape which becomes wider as it becomes closer to the through hole 13.

That is, a width on a left side of a GND conductor pattern 121a of the characteristic impedance control area 1 16a is narrow, and becomes wider as it becomes closer to the through hole 13 on a right side. In contrast thereto, a width on a left side of a GND conductor pattern 121b of the characteristic impedance control area 2 16b is wide, and becomes narrower as a distance from the through hole 13 on a right side becomes larger.

That is, a GND conductor pattern 121 is formed so as to be symmetrical at a front and back of the through hole 13. By adopting such structure, a coupling capacitance capacity between the differential wiring 11 and the GND conductor pattern 121 gradually increases as it becomes closer to the through hole. By doing so, it is possible to gradually decrease a reactance component which is a sum with the inductance capacity of the differential wiring, and to gradually make the characteristic impedance smaller.

By the structure of the printed circuit board 1 shown in FIG. 1, it becomes possible to make gradual a severe change of the characteristic impedance generated at the connecting portion of the differential wiring 11 and the through hole 13 of the transmission line, and to suppress a deterioration of a transmission characteristics by the reflection for both of a transmission from the differential wiring (surface layer) 11a to the differential wiring (internal layer) 11b, and a transmission from the differential wiring (internal layer) 11b to the differential wiring (surface layer) 11a. The detailed explanation of the GND conductor pattern will be made later.

<Storage System External Appearance>

Figure 3:
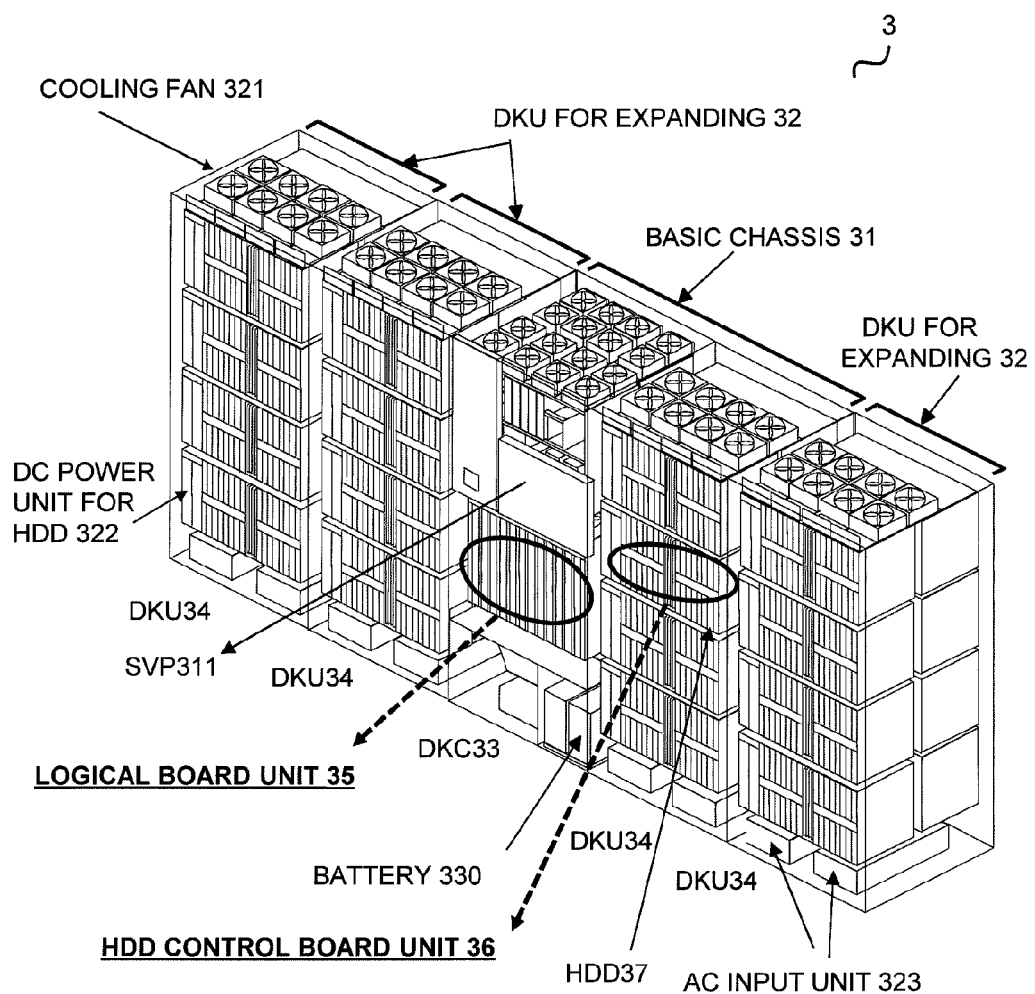
FIG. 3 is a view of an external appearance of a storage system applied with the present invention.

FIG. 3 is an external appearance view of the storage system applied with the present invention.

A storage system 3 is configured from a basic chassis 31 and a DKU (Disk Unit) for expanding 32. The basic chassis 31 is configured from a DKC (Disk Controller) 33 which is a controller for controlling the storage system 3, and a DKU 34 with a large number (more than few hundred) of HDDs 37 built therein. The DKU for expanding 32 is the DKU 34.

The DKC 33 is equipped with a logical board unit 35, a battery 330 which provides electric power for operating the logical board unit 35 during an external power discontinuity, a SVP (Service Processor) 311 used by a maintenance person for analyzing a failure information or performing diagnosis of the system, a cooling fan 321 for cooling the logical board unit 35 and the like, and an AC input unit 323 of the external power.

The DKU 34 is equipped with a large number of HDDs 37, a DC power unit for HDD 322 and the AC input unit 323 for supplying electric power to the HDD 37, a HDD control board unit 36 for connecting the HDD 37 and the DKC 33, and the cooling fan 321 for cooling the HDD control board unit 36 and the HDD 37.

A differential signal of the PCIe I/F is wired to the logical board unit 35, and a differential signal of the SAS I/F is wired to the HDD control board unit 36.

<Storage System Interior>

Figure 4:
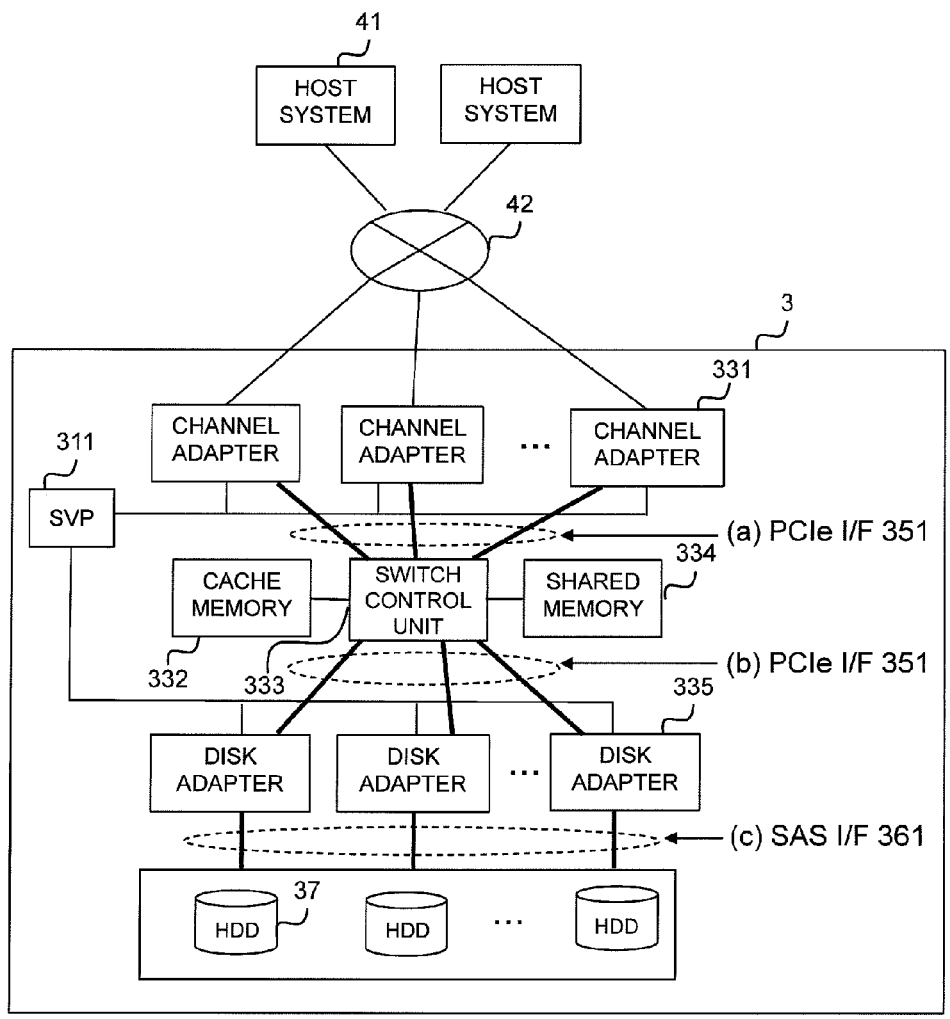
FIG. 4 is an internal block diagram of the storage system.

FIG. 4 is an internal block diagram of the storage system 3.

The storage system 3 is connected to one or more host systems 41 via a network 42. The storage system 3 is equipped with a plurality of channel adapters 331, a cash memory 332, a switch control unit 333, a shared memory 334, a plurality of disk adapters 335, the SVP 311, and a plurality of the HDDs 37. Further, although not shown, a MP (Micro Processor) for controlling the overall DKC 33 is also provided.

The channel adapter 331 is a controller which connects to the network 42, receives an I/O command (a write command or a read command) from the host system 41, and transfers the received I/O command to the switch control unit 333.

The cash memory 332 and the shared memory 334 are a volatile memory such as a DRAM (Dynamic Random Access Memory) and/or a non-volatile memory such as a flash memory, and store a write data from a host or various control information for controlling a disk array system, and the like.

The switch control unit 333 is connected to the channel adapter 331, the cash memory 332, the shared memory 334, and the disk adapter 335, and controls the transmitting and receiving of commands and data. The channel adapter 331 and the switch control unit 333, and the switch control unit 333 and the disk adapter 335, are connected by a high-speed differential signal of the PCIe I/F 351.

The disk adapter 335 is a controller which controls the writing of data to the HDD 37 from the switch control unit 333, and the reading of data from the HDD 37 to the switch control unit 333. The disk adapter 335 and the HDD 37 are connected by a high-speed differential signal of the SAS I/F 361.

<Transmission Line Mounting>

Figure 5:
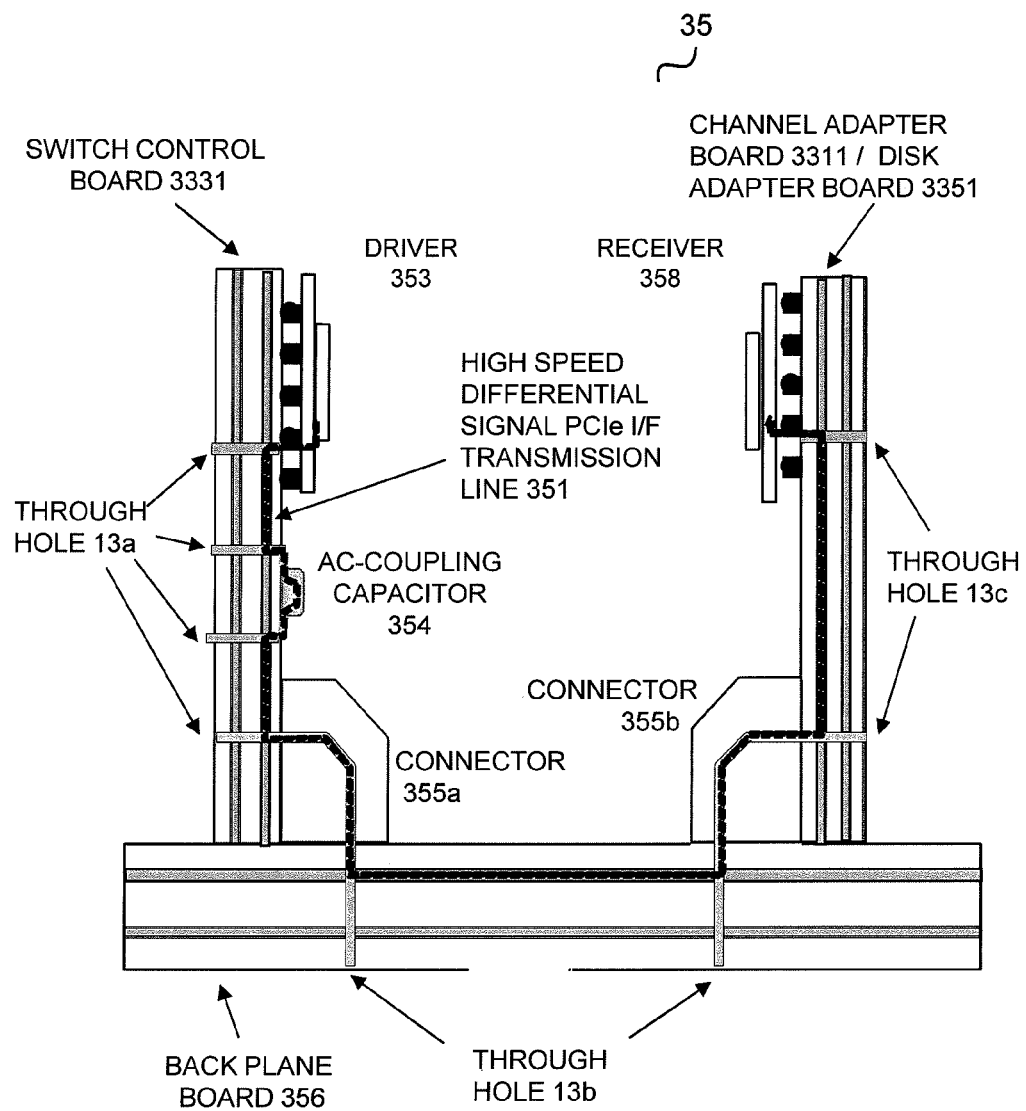
FIG. 5 is a view showing a mounting image of a PCIe interface transmission line at a logical board unit.
Figure 6:
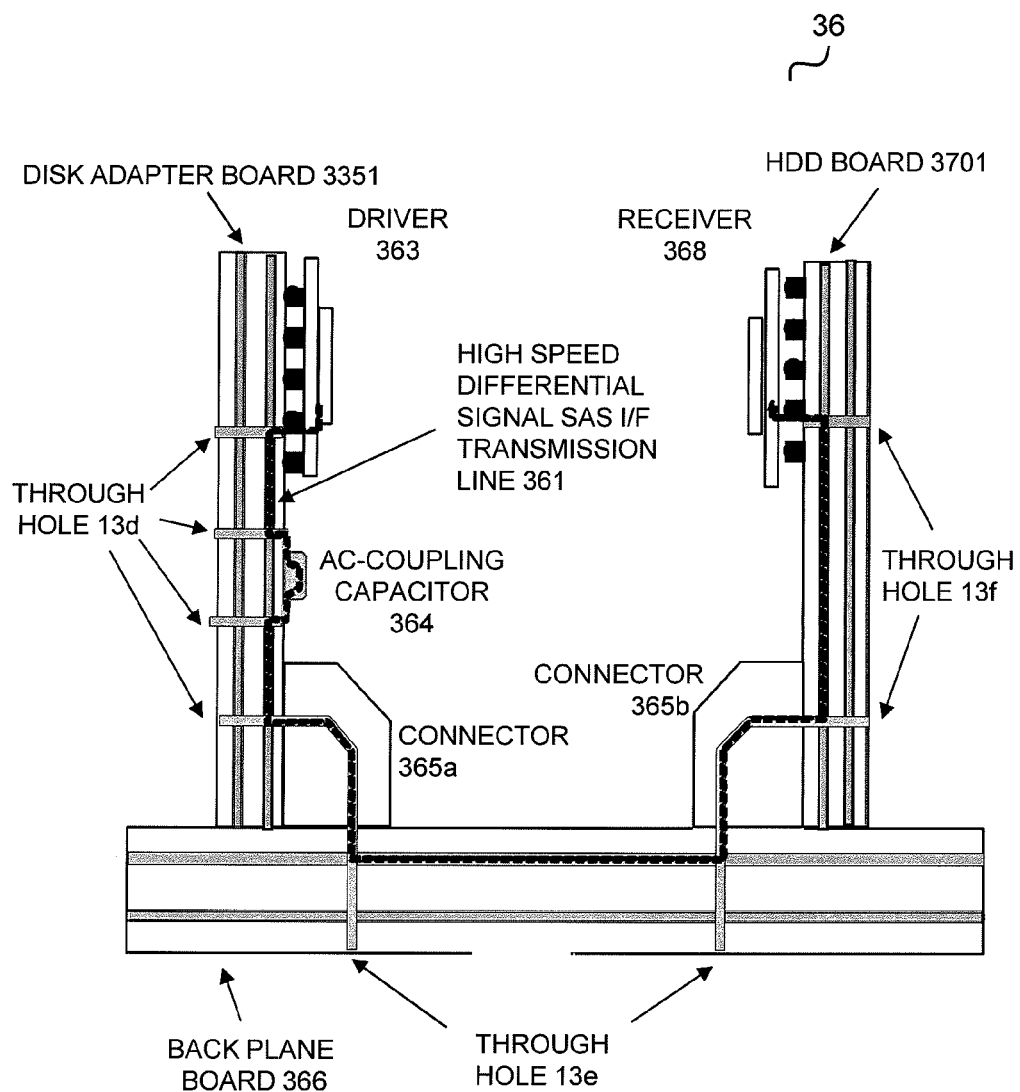
FIG. 6 is a view showing a mounting image of a SAS interface transmission line at a HDD control board unit.

FIG. 5 is a view of a mounting image of a PCIe interface transmission line at the logical board unit 35. FIG. 6 is a view of a mounting image of a SAS interface transmission line at the HDD control board unit 36.

As is shown in FIG. 5, in the logical board unit 35, a switch control board 3331 of the switch control unit 333 and a channel adapter board 3311 or a disk adapter board 3351 are electrically connected by a backplane board 356. Further, a driver controller 353 mounted to the switch control board 3331, and a receiver controller 358 mounted to the channel adapter board 3311 or the disk adapter board 3351 are connected by a PCIe I/F transmission line 351 which is a high-speed differential signal, via the through hole 13a, an AC coupling capacitor 354, a connector 355a, the backplane board 356, the through hole 13b, the connector 355b, and the through hole 13c.

As is explained above, the switch control unit 333 is connected with a large number of the channel adapters 331 and a large number of the disk adapters 335, so that a large number of wirings and through holes are created in each board. That is, in the PCIe I/F transmission line 351, a portion in which the inconsistency of the characteristic impedance is generated (for example, in the vicinity of the through holes 13a to 13c) exists in large number.

As is shown in FIG. 6, in the HDD control board unit 36, the disk adapter board 3351 and a HDD board 3701 are electrically connected by a backplane board 366. Further, a driver controller 363 mounted to the disk adapter board 3351 and a receiver controller 368 mounted to the HDD board 3701 are connected by a SAS I/F transmission line 361 which is a high-speed differential signal, via the through hole 13d, an AC coupling capacitor 364, a connector 365a, the backplane board 366, the through hole 13e, the connector 365b, and the through hole 13f. The HDD board 3701 is connected with a large number of the HDDs 37, so that the number of signal lines between the disk adapter board 3351 and the HDD board 3701 are large, and a large number of wirings and a large number of through holes are created in each board. That is, similarly to FIG. 5, in the SAS I/F transmission line 361, a portion in which the inconsistency of the characteristic impedance is generated (for example, in the vicinity of the through holes 13d to 13f) exists in large number. Further, in the PCIe I/F transmission line 351 and the SAS I/F transmission line 361, signals with a frequency of few GHz or more are being transmitted bi-directionally.

<Embodiment 1>

Figure 7:
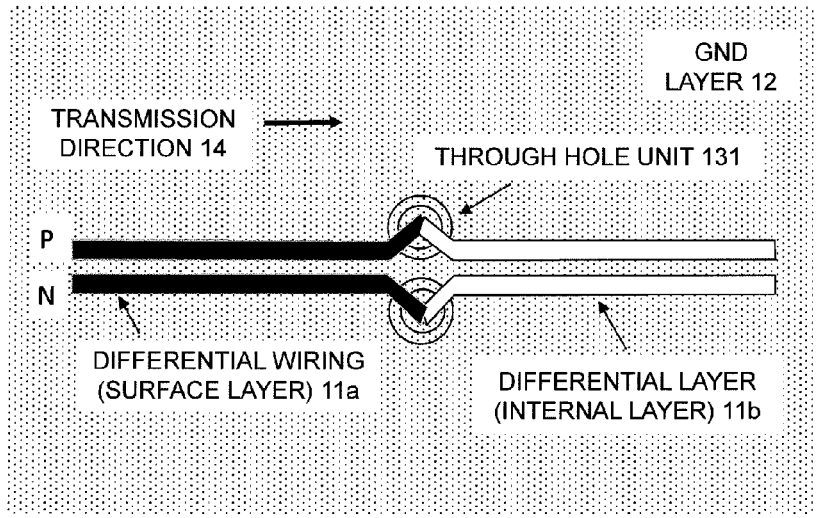
FIG. 7 is a perspective view of a connecting portion of a differential wiring of a transmission line of a high-speed differential signal and a through hole visually observed from above a conventional printed circuit board.

FIG. 7 is a perspective view of the connecting portion of the differential wiring and the through hole of the transmission line of the high-speed differential signal viewed from above the conventional printed circuit board.

In the conventional printed circuit board 2, as is shown in FIG. 7, a P side and an N-side of the differential wiring (surface layer) 11a are connected to a P-side and an N-side of the differential wiring (internal layer) 11b at a through hole portion 131, one or more layers of the GND layer 12 are formed between the layer formed with the differential wiring 11a and the layer formed with the differential wiring 11b, and the insulating layer 18 is formed between each layer with a material such as the glass epoxy resin. Therefore, with respect to a signal transmission direction 14, the inconsistency of the characteristic impedance at the connecting portion of the differential wiring (surface layer) 11a and the through hole portion is large, and a waveform of the signal transmitted is disturbed by the reflection. Similarly, in the signal transmission from a differential wiring (internal layer) 11b to the through hole portion 131, the reflection by the inconsistency of the characteristic impedance at the connecting portion is generated. Therefore, in the present invention, the GND conductor pattern shown in FIG. 8 and FIG. 9 is formed in the GND layer 12 closest to the differential wiring, so as to enable the reduction of the reflection.

Figure 8:
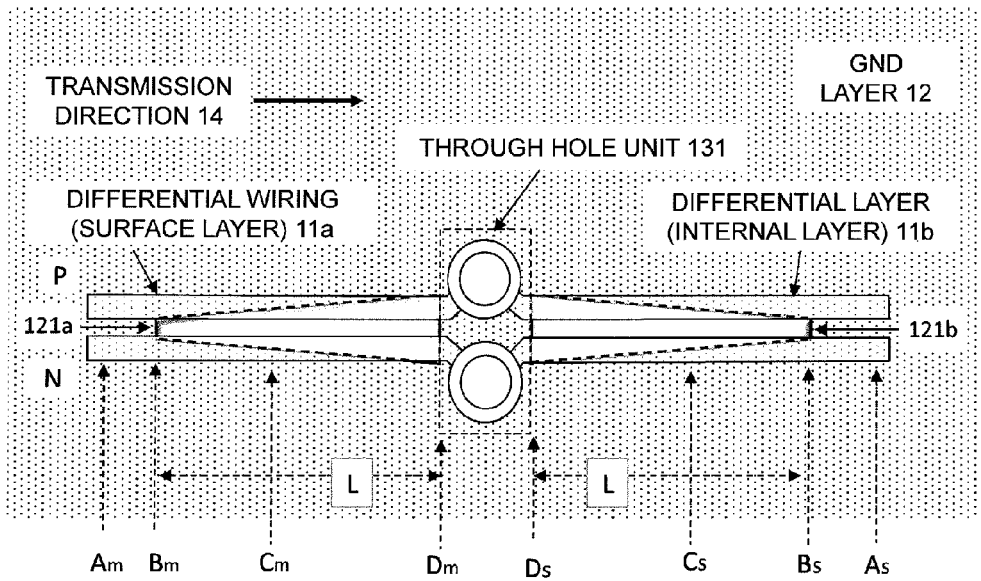
FIG. 8 is a perspective view of the connecting portion of the differential wiring of the transmission line of the high-speed differential signal and the through hole visually observed from above a printed circuit board of embodiment 1.
Figure 9:
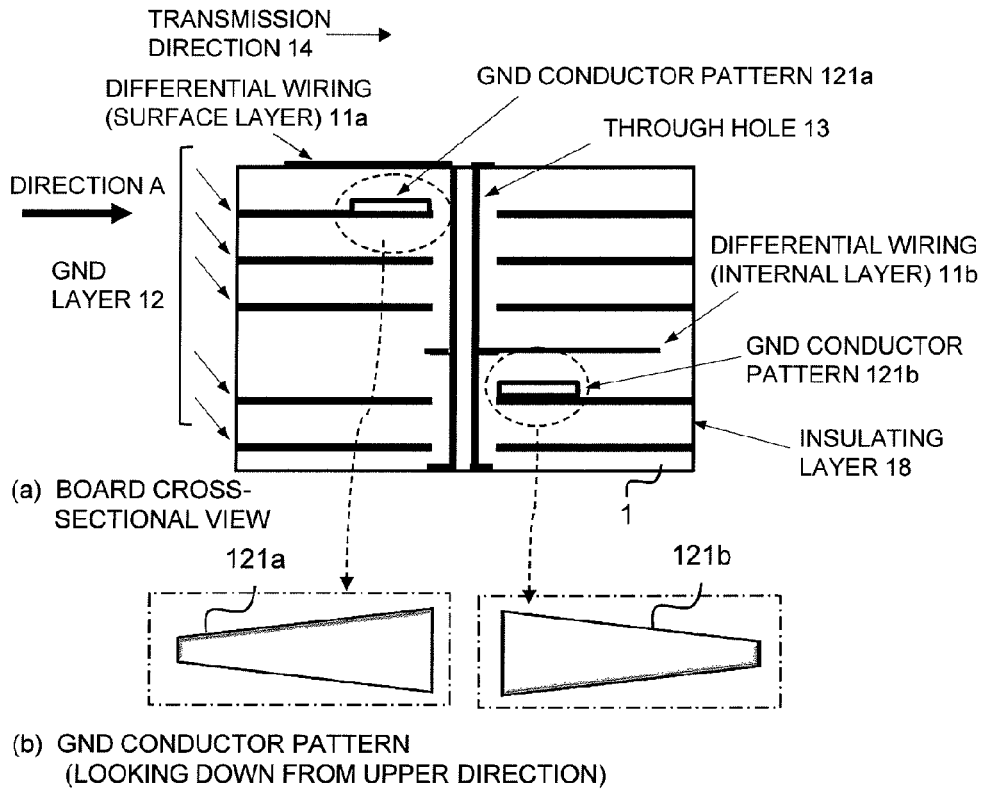
FIG. 9 is a view showing the printed circuit board cross-section and a GND conductor pattern of embodiment 1.
Figure 9:
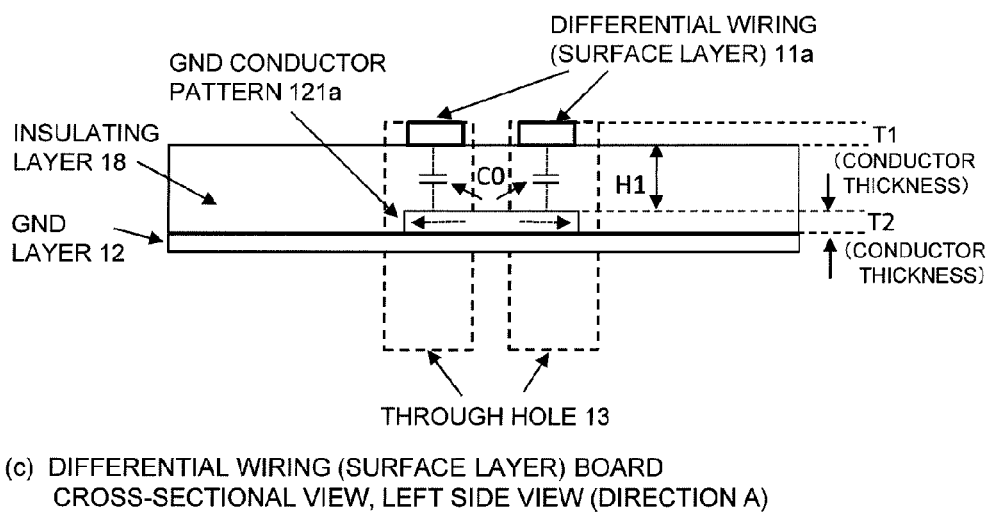

FIG. 8 is a perspective view of the connecting portion of the differential wiring of the transmission line of the high-speed differential signal and the through hole visually observed from above a printed circuit board of embodiment 1. FIG. 9 is a view showing the printed circuit board cross-section and the GND conductor pattern in embodiment 1.

As is shown in FIG. 8, The GND conductor pattern 121a of the trapezoid shape is formed, on the GND layer 12 which is the closest and which opposes the differential wiring (surface layer) 11a, so as to face the differential wiring (surface layer) 11a. The trapezoid shape of the GND conductor pattern 121a is of a shape in which an opposing area of the GND conductor pattern 121a opposing the differential wiring (surface layer) 11a becomes gradually larger towards the through hole portion 131. That is, the GND conductor pattern 121a and the P-side and the N-side of the differential wiring (surface layer) 11a starts opposing (over lapping) from point Bm. A conductor pattern width of the P-side and the N-side of the differential wiring (surface layer) 11a is set to W, and a conductor thickness is set to T1. Further, at point Cm, half the width of the differential wiring (surface layer) 11a is opposed to the GND conductor pattern 121a. Lastly, at point dm which is a boundary with the through hole portion 131, the differential wiring (surface layer) 11a is opposed to the GND conductor pattern 121a at a same width as the width of the differential wiring (surface layer) 11a.

That is, the GND conductor pattern 121a takes an isosceles trapezoidal shape, in which an upper side (point Bm) is an interval (set as an interval S) between the P-side and the N-side of the differential wiring (surface layer) 11a, a base (point Dm) is a width (2×W+S) opposing straddling both of the P-side and the N-side of differential wiring (surface layer) 11a, and a height L (a length from point Bm to point Dm). Further, a thickness T2 of the GND conductor pattern 121a is set to a uniform thickness.

Further, similarly to the differential wiring (surface layer) 11a, the differential wiring (internal layer) 11b forms the GND conductor pattern 121b of the trapezoidal shape, on the GND layer 12 which is the closest and which opposes the differential wiring (internal layer) 11b, so as to face the differential wiring (internal layer) 11b. The shape of the GND conductor pattern 121b takes an isosceles trapezoidal shape, in which an opposing area of the GND conductor pattern 121b opposing the differential wiring (internal layer) 11b becomes gradually larger towards the through hole portion 131 (from point Bs towards point Ds). Further, a thickness of the GND conductor pattern 121b is set to a uniform thickness, to T2.

That is, the GND conductor pattern 121b with respect to the differential wiring (internal layer) 11b has an identical shape as the GND conductor pattern 121a, and is formed on the GND layer 12 so as to be axisymmetric to a central line between point Dm and point Ds.

A clearance shape of the through hole portion 131 takes a shape so that a boundary with the differential wiring (surface layer) 11a becomes perpendicular with respect to the transmission direction 14 of the differential wiring (surface layer) 11a. As an example of the clearance shape, a long ellipse shape, an octagon shape, a hexagonal shape may be adopted, in addition to a rectangular shape shown in FIG. 8.

As is explained above, by forming the GND conductor pattern 121 on the GND layer 12 closest to the differential wiring 11, it becomes possible to make the coupling capacitance capacity between the differential wiring 11 and the GND conductor pattern 121 to gradually increase towards the through hole portion 131 and to gradually decrease the characteristic impedance.

FIG. 9 is a view showing the printed circuit board cross-section and the GND conductor pattern in embodiment 1. FIG. 9(a) is a cross-sectional view of the printed circuit board 1. Further, FIG. 9(b) is an overview (visual viewed) of the GND conductor pattern 121 from above. FIG. 9(c) is shows the printed circuit board cross-section in the vicinity of the differential wiring (surface layer) 11a of the printed circuit board 1 visually viewed from direction A.

As is shown in FIG. 9(a), the GND conductor pattern 121a shown in FIG. 9(b) is formed to the GND layer 12 closest to the differential wiring (surface layer) 11a, and the GND conductor pattern 121b is formed to the GND layer 12 closest to the differential wiring (internal layer) 11b.

In general, the differential wiring 11, the GND layer 12, and the power layer are formed using a metal material such as copper having high conductivity and low in cost, and the insulating layer 18 is formed using an insulating material such as the glass epoxy resin. However, in the present invention, the materials are not limited to those listed above.

A reason for being capable of gradually decreasing the characteristic impedance will be explained in FIG. 9(c). The coupling capacitance capacity C between the differential wiring 11 and the GND conductor pattern 121 is represented by an equation (2).

[Equation 2]

$$C = \epsilon r \times \epsilon o \times A / d \qquad \text{Equation (2)}$$

Where $\epsilon r$ is a relative permittivity, $\epsilon o$ is a permittivity in vacuum, A is an opposing area of the conductor, and d is a conductor interval.

That is, the coupling capacitance capacity C may be increased, by increasing the opposing area A between the differential wiring (surface layer) 11a and the GND layer 12. Further, by decreasing the conductor interval d, that is, an interval H1 between the differential wiring (surface layer) 11a and the GND layer 12, it is possible to increase the coupling capacitance capacity C. The interval H1 may be freely changed, by changing the conductor thickness T2 of the GND conductor pattern 121. Further, the conductor thickness T1 of the differential wiring 11 and the conductor thickness T2 of the GND conductor pattern 121 may be the same, or may be different.

As is explained above, by changing the interval H1 and the opposing area A between the GND conductor patterns 121 opposing the differential wiring 11, it becomes possible to change a coupling capacitance capacity C of between-GNDs, and by balancing with the inductance component, it becomes possible to freely change the characteristic impedance Zo of the transmission path. That is, the coupling capacitance capacity C is increased by gradually widening the opposing area A towards the through hole portion 131, as is in the transmission direction 14. By doing so, the characteristic impedance Zo of the transmission path becomes small, so that it is possible to approximate to a characteristic impedance Zth of the through hole portion 131. Therefore, it becomes possible to suppress the reflection at the joining portion of the differential wiring 11 and the through hole 13 small.

<Characteristic Impedance Matching Circuit 1>

Figure 10:
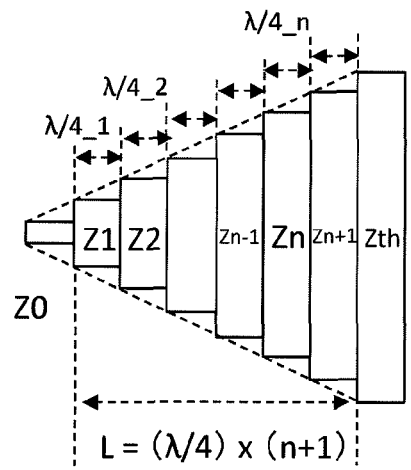
FIG. 10 is a view showing the GND conductor pattern using a characteristic impedance matching circuit of a wavelength of λ/4 in embodiment 1.
Figure 10:
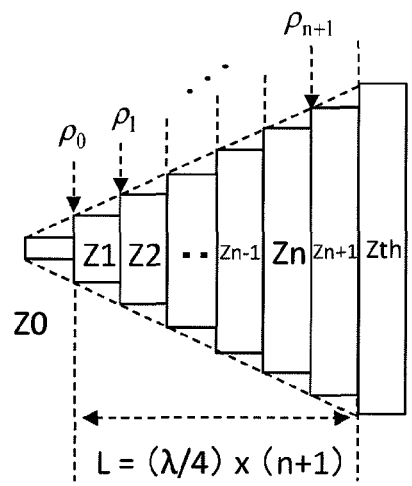

The configuration explained above will be explained in detail with reference to FIG. 10. FIG. 10 is a view showing the GND conductor pattern using a characteristic impedance matching circuit with a wavelength of $\lambda/4$ in embodiment 1. FIG. 10(a) shows the characteristic impedance, and FIG. 10(b) shows the coefficient of reflection.

In the present invention, the characteristic impedance matching circuit with the wavelength of $\lambda/4$ is formed, by providing a shape so that the opposing area A of the GND conductor pattern 121 opposing the differential wiring 11 becomes larger stepwise towards the through hole 13. By designing the transmission line so as to satisfy the specification of the characteristic impedance matching circuit with the wavelength of $\lambda/4$ shown in FIG. 10, it becomes possible to suppress the inconsistency of the characteristic impedance.

Here, $\lambda$ is a wavelength of a transmission signal, and in the case of a 10 Gbps (Giga bits per second) differential signal, the wave length is 6 cm in a basic frequency of 5 GHz. Further, Zo and Zth are characteristic impedance of the transmission line and the characteristic impedance of the through hole.

The characteristic impedance of the transmission path in the printed circuit board 1 using the GND conductor pattern 121 of the isosceles trapezoidal shape, may be approximated by the one in which the characteristics expressed by a rectangle of a width $\lambda/4$ (=1.5 cm) are arranged successively as is shown in FIG. 10. The characteristic impedance ($\Omega$) at each point may be represented by the equation (3) through the equation (5). For example, the characteristic impedance Z1 (transmission path) is a square root of a value obtained by multiplying the characteristic impedance Zo (output impedance) with the characteristic impedance Z2 (input impedance). The same applies to Z2 to Zn+1. Further, as is apparent from the following equations, a relationship of Z0 > Z1 > ... > Zn > Zn+1 holds. In addition, by increasing the number n+1 of splitting the transmission path to the width $\lambda/4$, it becomes possible to further reduce the difference of the characteristic impedances in the front and the back.

[Equation 3]

$$Z1 = \sqrt{Z0 \times Z2} \qquad \text{Equation (3)}$$

[Equation 4]

$$Zn = \sqrt{Z_{n-1} \times Z_{n+1}} \qquad \text{Equation (4)}$$

[Equation 5]

$$Z_{n+1} = \sqrt{Z_n \times Z_{th}} \qquad \text{Equation (5)}$$

Further, the coefficient of reflection $\rho$ of each point in the transmission path is represented by the following equations (6) through (8), using the characteristic impedance of each point calculated from the equations (3) through (5) indicated above.

[Equation 6]

$$\rho_0 = \frac{Z2 - Z0}{Z2 + Z0} \qquad \text{Equation (6)}$$

[Equation 7]

$$\rho_1 = \frac{Z3 - Z1}{Z3 + Z1} \qquad \text{Equation (7)}$$

[Equation 8]

$$\rho_{n+1} = \frac{Zth - Zn}{Zth + Zn} \qquad \text{Equation (8)}$$

Further, as a square root of a square sum $\rho$rss (Root Sum Square) of the coefficient of reflection $\rho$ of each point represented by the equation (9) is smaller, the reflection may be suppressed. Therefore, the value of n is determined so that the value of $\rho$rss becomes smaller than 0.1. By increasing the value of n, the difference of the characteristic impedances between each point becomes small, and the coefficient of reflection in each point becomes small. Therefore, it becomes possible to bring the value of $\rho$rss close to 0.

However, when the value of n is increased, a length L of the GND conductor pattern 121 of the isosceles trapezoidal shape explained above becomes longer as is represented by the equation (10), so that there is a possibility that the GND conductor pattern 121 may not be formed opposing the differential wiring. It is also possible to decrease the value of n, and shorten the length L of the GND conductor pattern 121, however, the reflection becomes larger and sufficient suppressing effect of the reflection cannot be obtained. Therefore, a threshold value capable of obtaining sufficient suppressing effect of the reflection and adequate length is set, a value of n which the threshold value becomes 0.1 or less, and determines the length L of the GND conductor pattern 121 in the equation (10).

[Equation 9]

$$\rho_{rss}(\rho_{rss}<0.1)=\sqrt[4]{|\rho^2_0|+|\rho^2_1|+...|\rho^2_{n+1}|} \quad \text{Equation (9)}$$

[Equation 10]

$$L=(\lambda/4)\times(n+1) \quad \text{Equation (10)}$$

<Cross-Sectional View of Each Point>

Figure 11:
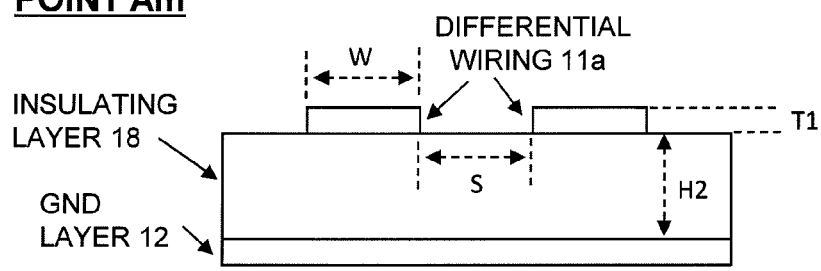
FIG. 11 is a cross-sectional view of the printed circuit board at point Am shown in FIG. 8.

Next, explanation is given on the shape of the printed circuit board cross-section and the characteristic impedance from point Am to point Dm, and from point As to point Ds. FIG. 11 is a printed circuit board cross-sectional view at point Am. The differential signal is transmitted from a near side towards a depth direction. The characteristic impedance Zo of the wiring at point Am of the differential wiring (surface layer) 11a portion is calculated from the equation (11), where εr is a relative permittivity of the insulating layer 18, H2 is a layer thickness between the printed circuit board surface layer and the insulating layer 18, W is the width of the wiring pattern, and T1 is the conductor thickness of the wiring pattern.

[Equation 11]

$$Zo = \frac{87}{\sqrt{\varepsilon r + 1.41}} \ln\left(\frac{5.98 \times H2}{0.8 \times W + T1}\right) \quad \text{Equation (11)}$$

Figure 12:
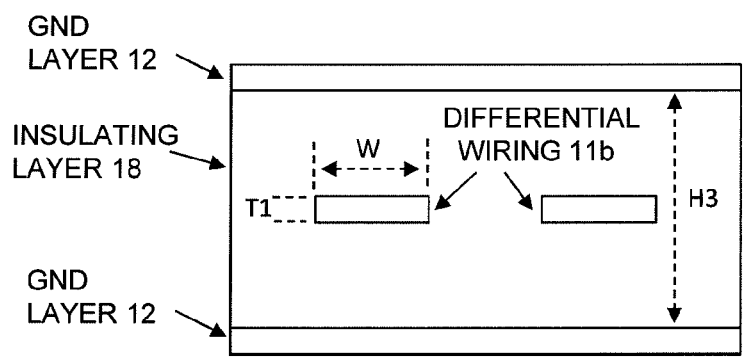
FIG. 12 is a cross-sectional view of the printed circuit board at point As shown in FIG. 8.

FIG. 12 is a printed circuit board cross-sectional view at point As. Similarly to FIG. 11, the differential signal is transmitted from the near side towards the depth direction. The characteristic impedance Zo of the wiring at point As of the differential wiring (internal layer) 11b portion is calculated from the equation (12), where εr is the relative permittivity of the insulating layer 18, H3 is a layer thickness of the insulating layer 18 positioned between the GND layers, W is the width of the wiring pattern, and T1 is the conductor thickness of the wiring pattern.

[Equation 12]

$$Zo = \frac{60}{\sqrt{\varepsilon r}} \ln\left(\frac{4 \times H3}{0.67 \times \pi \times (T1 + 0.8W)}\right) \quad \text{Equation (12)}$$

As is shown in a formula of computation of the characteristic impedance shown in the above-mentioned equation (11), equation (12), the characteristic impedance may be made small by making the distance H2 or H3 between the GND layer 12 opposing the differential wiring 11 small. Between point Bm and point Dm, and between point Bs and point Ds, the characteristic impedance changes stepwise to a small value from point Bm towards point Dm or from point Bs towards point Ds, in proportion to a ratio of the GND conductor pattern 121 opposing the line width W of the differential wiring 11.

Where Zam is the characteristic impedance of point Am, Zdm is the characteristic impedance of point Dm, Zas is the characteristic impedance of point As, and Zds is the characteristic impedance of point Ds, then the characteristic impedance Zcm of point Cm and the characteristic impedance Zcs of point Cs in which the GND conductor pattern 121 is opposing a half of the line width W of the wiring, respectively, hold the relationship of Zcm=(Zam+Zdm)/2, Zcs=(Zas+Zds)/2.

Figure 13:
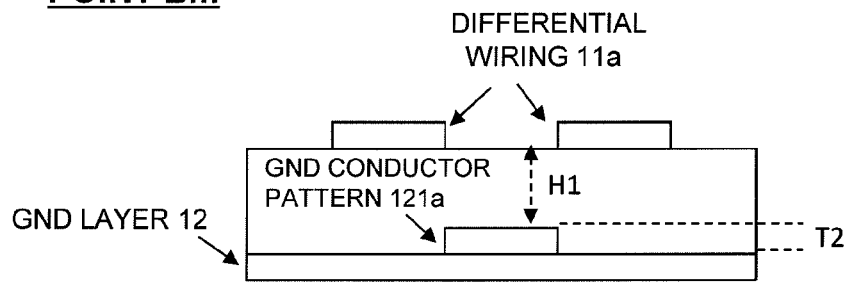
FIG. 13 is a cross-sectional view of the printed circuit board at point Bm shown in FIG. 8.
Figure 14:
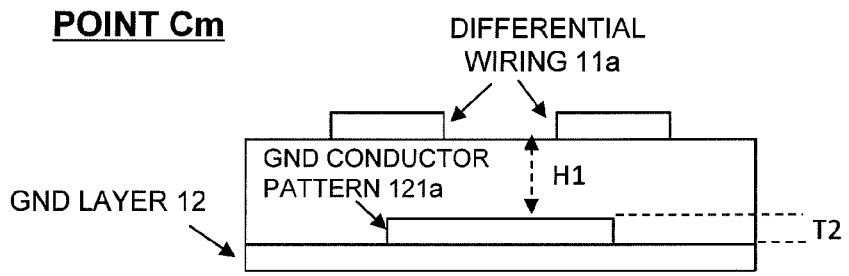
FIG. 14 is a cross-sectional view of the printed circuit board at point Cm shown in FIG. 8.
Figure 15:
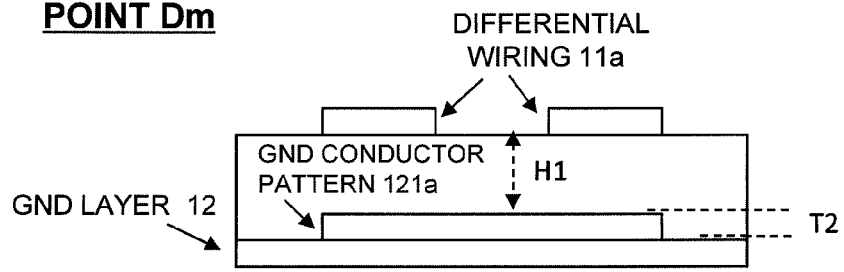
FIG. 15 is a cross-sectional view of the printed circuit board at point Dm shown in FIG. 8.

FIG. 13 is a printed circuit board cross-sectional view at point Bm. FIG. 14 is a printed circuit board cross-sectional view at point Cm. FIG. 15 is a printed circuit board cross-sectional view at point Dm. In either view, the differential signal is transmitted from a near side towards a depth direction.

First, as is shown in FIG. 13, the GND conductor pattern 121a of a width S starts to be formed from point Bm. However, at point Bm, portions opposing the P-side and the N-side of the differential wiring (surface layer) 11a do not exist, and the width of the GND conductor pattern 121a increases towards point Cm, so that the opposing portion gradually increases.

Next, as is shown in FIG. 14, portions opposing the P-side and the N-side of the differential wiring (surface layer) 11a at point Cm respectively becomes half the wiring pattern width W. Further, a height H1 of the corresponding portion is a value obtained by subtracting the conductor thickness T2 of the GND conductor pattern 121a from the height H2 of the non-opposing portion.

Lastly, as is shown in FIG. 15, portions opposing the P-side and the N-side of the differential wiring (surface layer) 11a at point Dm respectively becomes the wiring pattern width W.

As is shown in FIG. 13 through FIG. 15 explained above, an effective height of the portions opposing the P-side and the N-side of the differential wiring (surface layer) 11a becomes smaller from H2 to H1, so that the characteristic impedance Zo of the differential wiring (surface layer) 11a becomes smaller as it becomes closer to the through hole 13, as is represented in the equation (11), and it becomes possible to approximate to the value of the characteristic impedance Zth of the through hole 13.

Figure 16:
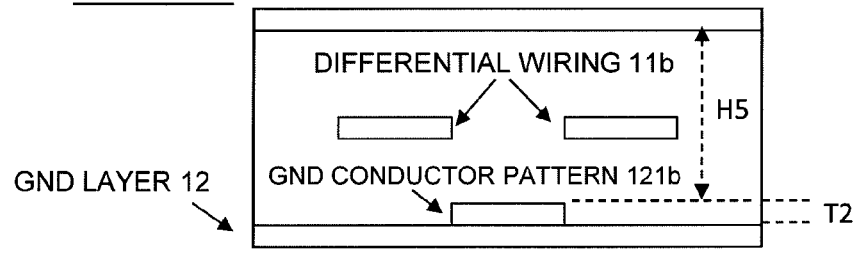
FIG. 16 is a cross-sectional view of the printed circuit board at point Bs shown in FIG. 8.
Figure 17:
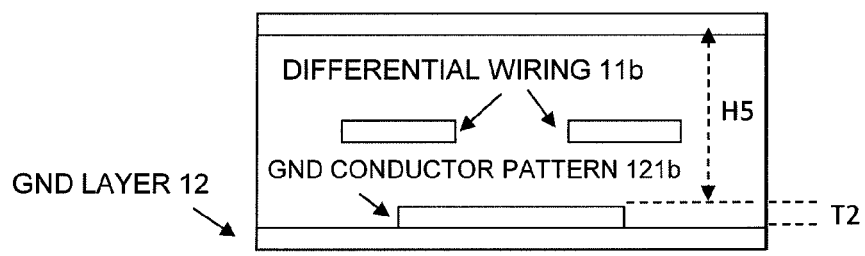
FIG. 17 is a cross-sectional view of the printed circuit board at point Cs shown in FIG. 8.
Figure 18:
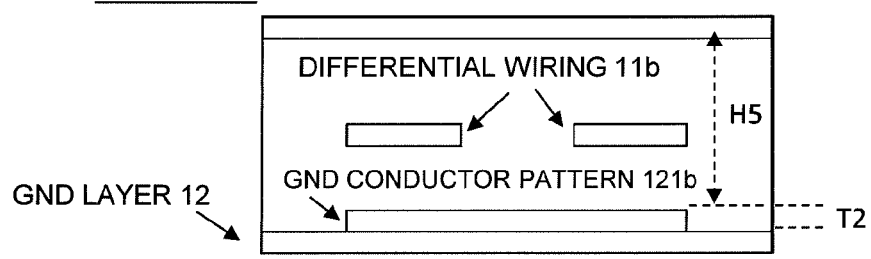
FIG. 18 is a cross-sectional view of the printed circuit board at point Ds shown in FIG. 8.

FIG. 16 is a printed circuit board cross-sectional view at point Bs. FIG. 17 is a printed circuit board cross-sectional view at point Cs. FIG. 18 is a printed circuit board cross-sectional view at point Ds. In either view, the differential signal is transmitted from the near side towards the depth direction.

First, similarly to FIG. 13, as is shown in FIG. 16, the GND conductor pattern 121b of the width S starts to be formed from point Bs. However, at point Bs, portions opposing the P-side and the N-side of the differential wiring (internal layer) 11b do not exist, and the width of the GND conductor pattern 121b increases towards point Cs, so that the opposing portion gradually increases.

Next, similarly to FIG. 14, as is shown in FIG. 17, portions opposing the P-side and the N-side of the differential wiring (internal layer) 11b at point Cs respectively becomes half the wiring pattern width W. Further, a height H5 of the corresponding portion is a value obtained by subtracting the conductor thickness T2 of the GND conductor pattern 121b from the height H3 of the insulating layer 18 of the non-opposing portion.

Lastly, similarly to FIG. 15, as is shown in FIG. 18, portions opposing the P-side and the N-side of the differential wiring (internal layer) 11b at point Ds respectively becomes the wiring pattern width W.

As is shown in FIG. 16 to FIG. 18, an effective height of the portions opposing the P-side and the N-side of the differential wiring (internal layer) 11b becomes smaller from H3 to H5, so that the characteristic impedance Zo of the differential wiring (internal layer) 11b become smaller as it becomes closer to the through hole 13, as is represented by the equation (12), and it becomes possible to approximate to the characteristic impedance Zth of the through hole 13.

As is explained above, the GND conductor pattern 121 of the isosceles trapezoidal shape is formed on the GND layer 12 closest to the differential wiring 11, so as to be symmetrical with respect to a central line of the through hole 13 orthogonal to the differential wiring 11. By adopting such a structure, it becomes possible to gradually increase the coupling capacitance capacity C between the differential wiring 11 and the GND conductor pattern 121 as it becomes closer to the through hole. Accompanying thereto, it becomes possible to gradually decrease a reactance component which is a sum with the inductance capacity of the differential wiring 11, and to make the characteristic impedance gradually small.

Therefore, it becomes possible to make a steep change of the characteristic impedance generated at the connecting portion of the differential wiring 11 and the through hole 13 gradual, and to suppress degradation of the transmission characteristics by the reflection. In addition, it is not necessary to change the width of the pattern of the differential wiring 11 and to change the interval of the P-side and the N-side of the differential wiring 11 as is in the conventional art, so that the wiring design on the printed circuit board becomes easy, and a high-density mounting is made possible.

Further, in the present embodiment, the GND conductor pattern 121 is made in a trapezoidal shape such as the isosceles trapezoid, however, equivalent effect may be obtained by adopting the GND conductor pattern of a triangular shape such as a right triangle facing both of the P-side and the N-side of the differential wiring 11.

Further, since a necessary area for wiring is not drastically increased in the case where a numerous differential wirings exist, the present invention may be applied to a printed circuit board which is mounted with an I/F controller or an expander LSI in which high-density wiring is necessary. In addition, a deficiency of the wiring area is not likely to occur, so that the number of wiring layers of the printed circuit board may be decreased, and as a result thereof, the cost of the printed circuit board and the cost of the system may be reduced.

Further, in embodiment 1, explanation is given on the case where the differential wiring 11a of the surface layer and the differential wiring 11b of the internal layer are connected at the through hole 13. However, the present invention may be applied to the case where the differential wirings of the surface layers (the surface or the rear surface of the printed circuit board) are connected at the through hole, the case where the differential wirings of the internal layers are connected at the through hole, and the case where more than two pairs of the differential wirings of the surface layer of the printed circuit board are connected at the through hole, and further the differential wiring of the internal layer is connected at the through hole, and may obtain the effect mentioned above.

Further, in embodiment 1, explanation is given on an example where the angle obtained by the differential wiring 11a of the surface layer and the differential wiring 11b of the internal layer is 180° (straight line), however, the angle is not limited thereto and the present invention may be applied to an arbitrary angle such as 90°, 45°, 30°, and 0°. Further, the GND conductor pattern may be formed to the GND layer closest not to the differential wiring but to a single wiring, in a shape such as the isosceles trapezoidal shape or isosceles triangle. Moreover, the through hole is given as an example of a via. However, the present invention may be applied to a connection of wiring which connects between layers only, such as a blind via or a buried via, and may obtain an equivalent effect.

<Embodiment 2>

Figure 19:
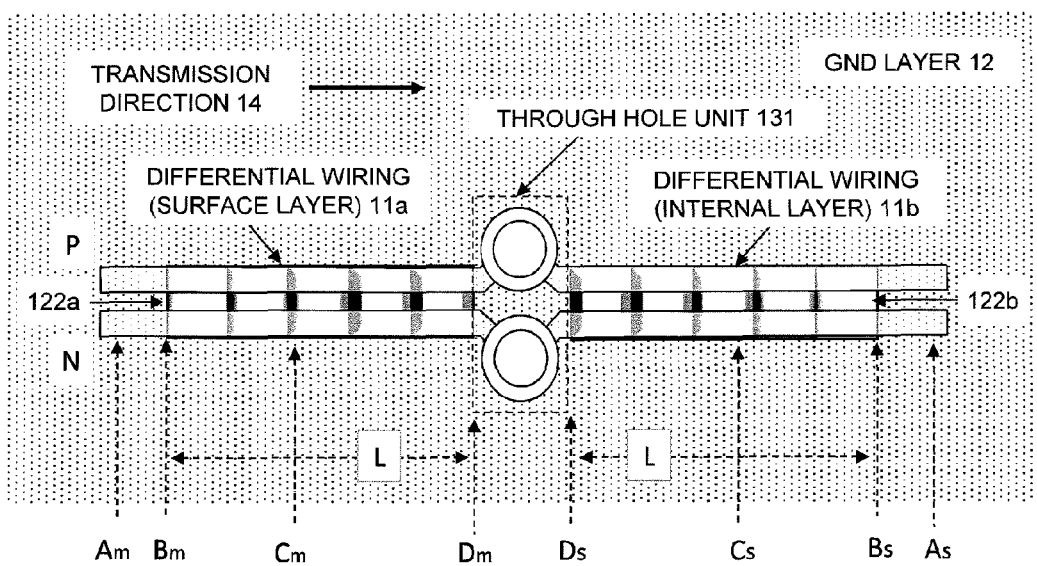
FIG. 19 is a perspective view of the connecting portion of the differential wiring of the transmission line of the high-speed differential signal and the through hole visually observed from above the printed circuit board of embodiment 2.
Figure 20:
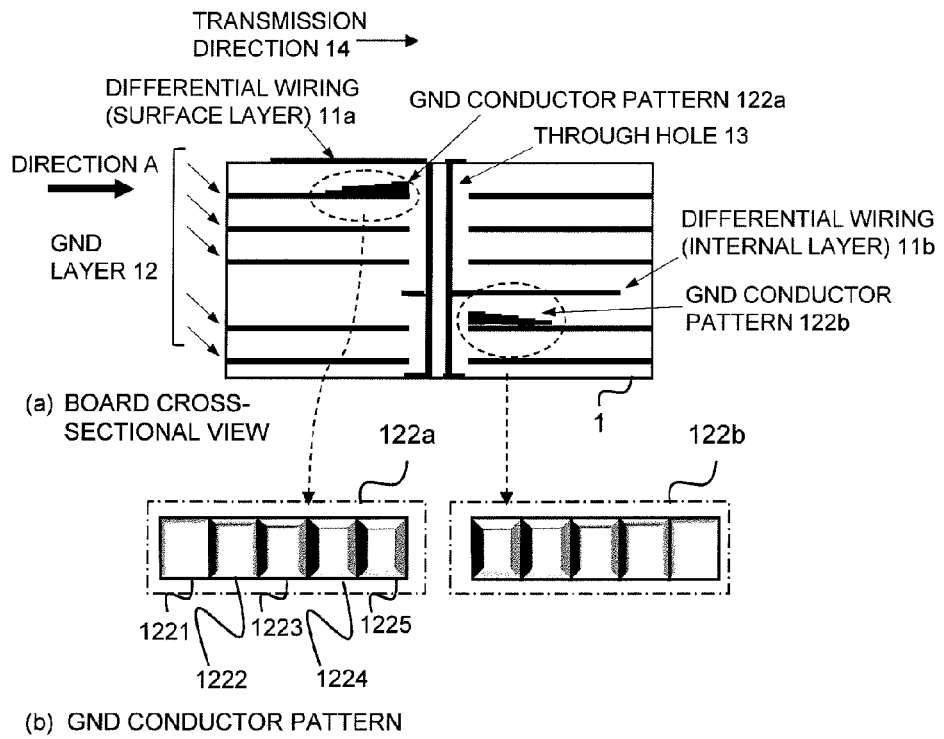
FIG. 20 is a view showing the printed circuit board cross-section and the GND conductor pattern in embodiment 2.
Figure 20:
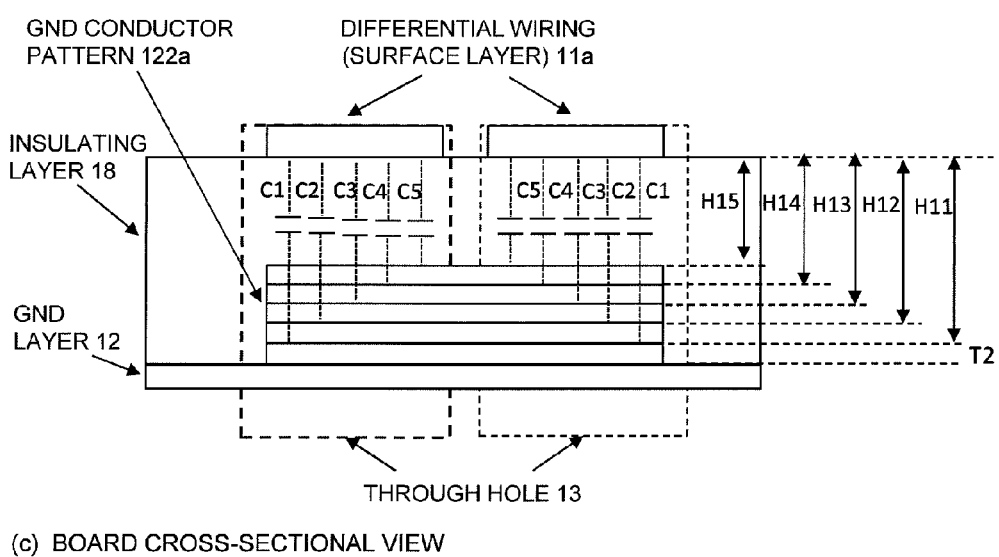
Figure 21:
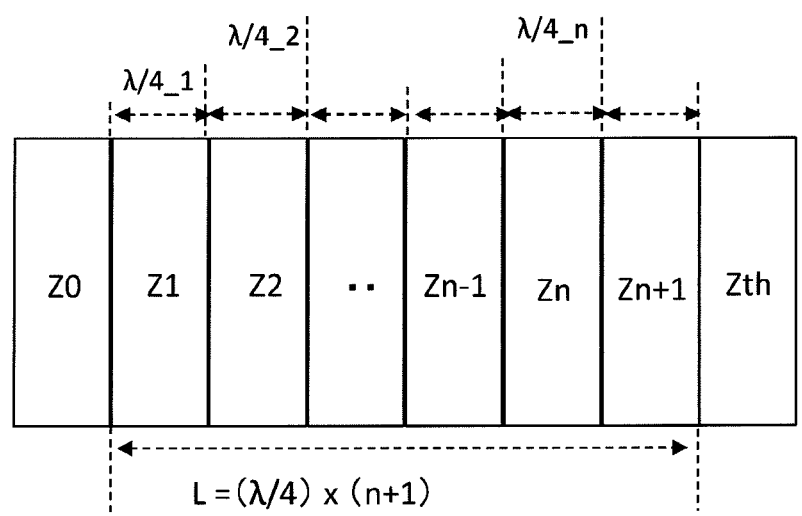
FIG. 21 is a view showing the GND conductor pattern using a characteristic impedance matching circuit of a wavelength of λ/4 in embodiment 2.

FIG. 19 is a perspective view of the printed circuit board of embodiment 2 visually viewed from above. FIG. 20 is a view showing the printed circuit board cross-section and the GND pattern in embodiment 2. FIG. 21 is a view showing the GND conductor pattern using the characteristic impedance matching circuit with the wavelength of λ/4 of embodiment 2.

In embodiment 1, a configuration of gradually increasing the opposing area of the GND conductor pattern 121 opposing the differential wiring 11, and increasing the coupling capacitance capacity C between the differential wiring 11 and the GND conductor pattern 121, so as to make the characteristic impedance Zo of the differential wiring 11 closer stepwise to the characteristic impedance Zth of the through hole 13, is shown.

In embodiment 2, an explanation will be given on a structure in which an opposing height (distance) of a GND conductor pattern 122 opposing the differential wiring 11 is decreased stepwise, so as to increase the coupling capacitance capacity C.

As is shown in FIG. 19, a rectangular GND conductor pattern 122a is formed on a GND layer 12 opposing the differential wiring (surface layer) 11a so as to face the differential wiring (surface layer) 11a. Further, a rectangular GND conductor pattern 122b is formed on the GND layer 12 opposing the differential wiring (internal layer) 11b so as to face the differential wiring (internal layer) 11b.

Then, the GND conductor pattern 122a and the GND conductor pattern 122b are thickened stepwise as they become closer to the through hole portion 131.

With such shape of the GND conductor pattern 122, similarly to embodiment 1, the coupling capacitance capacity C between the differential wiring 11 and the GND conductor pattern 122 may be gradually increased towards the through hole portion 131 side, so that the characteristic impedance Zo may be gradually made small.

The reason thereof will be explained in detail with reference to FIG. 20. FIG. 20(a) is a cross-sectional view of the printed circuit board 1. Further, FIG. 20(b) is a view looking down the GND conductor pattern 122 from above. Further, FIG. 20(c) shows a printed circuit board cross-section in the vicinity of the differential wiring (surface layer) of the printed circuit board viewed from direction A.

As is shown in FIG. 20(a), the GND conductor pattern 122a shown in FIG. 20(b) is formed on the GND layer 12 closest to the differential wiring (surface layer) 11a, and the GND conductor pattern 122b is formed on the GND layer 12 closest to the differential wiring (internal layer) 11b. The GND conductor patterns 122a and 122b are formed from GND conductor sub patterns 1221, 1222, 1223, 1224, and 1225 with different heights.

The thickness of the GND conductor sub pattern 1221 is the conductor thickness T2, the thickness of the GND conductor sub pattern 1222 is T2×2, and the thickness of the GND conductor sub pattern 1225 is T2×5. Therefore, the distance H to the differential wiring (surface layer) 11a becomes smaller stepwise from H11>H12>H13>H14>H15, so that the coupling capacitance capacity C becomes larger from C1<C2<C3<C4<C5 as it becomes closer to the through hole 13.

Further, it is possible to form the GND conductor sub pattern not in a cuboid shape, but a solid shape with an area of an upper side smaller than an area of a base. In the case of the solid shape with the area of the upper side smaller than the area of the base, a ratio of decreasing the area should be smaller than the ratio of decreasing the height. By doing so, it becomes possible to make the coupling capacitance capacity C larger.

<Characteristic Impedance Matching Circuit 2>

FIG. 21 is a view showing the GND conductor pattern using the characteristic impedance matching circuit with the wavelength of $\lambda/4$ in embodiment 2. By forming a shape in which the distance H between the differential wiring 11 and the opposing GND conductor pattern to become smaller stepwise towards the through hole 13, the characteristic impedance matching circuit with the wavelength of $\lambda/4$ is formed. By designing the transmission line so as to satisfy the specification of the characteristic impedance matching circuit with the wavelength of $\lambda/4$ as is shown in FIG. 21, it becomes possible to restrain the inconsistency of the characteristic impedance.

Further, in embodiment 2, similarly to embodiment 1, the characteristic impedance of the transmission path may be calculated from the Equation (3) through Equation (5). Similarly, the coefficient of reflection $\rho$ at the connecting portion between the GND conductor sub patterns may be calculated from the Equation (6) through Equation (8), and $\rho rss$ may be calculated from Equation (9). Therefore, similarly to embodiment 1, the value of n is obtained so as to make the value of $\rho rss$ to be smaller than 0.1, and the length L of the GND conductor pattern 122 is determined in Equation (10).

As is explained above, a plurality of GND conductor sub patterns having different height (thickness) are formed on the GND layer 12 closest to the differential wiring 11, so as to be axisymmetrical with respect to the central line of the through hole 13 orthogonal to the differential wiring 11. By taking such structure, it becomes possible to gradually increase the coupling capacitance capacity C between the differential wiring 11 and the GND conductor pattern 122 as it becomes closer to the through hole, and to gradually decrease the characteristic impedance. Therefore, the step change of the characteristic impedance generated at the connecting portion of the differential wiring 11 and the through hole 13 may be made gradual, so that it becomes possible to restrain the degradation of the transmission characteristics by reflection.

Embodiment 1 and embodiment 2 may be combined to provide a GND conductor pattern in which the opposing area A is increased and the height H is decreased while it becomes closer to the through hole 13. Further, the GND conductor pattern explained above may be formed on the P-side and the N-side of the differential signal, respectively.

Further, conservation of space may be achieved by forming the GND conductor sub pattern group not only to the transmission line of the differential signal, but also to the transmission line of a single signal (or, to both of the P-side and the N-side of the differential signal).

Further, since a necessary area for wiring is not drastically increased in the case where a numerous differential wirings exist, the present invention may be applied to a printed circuit board which is mounted with an I/F controller or an expander LSI in which high-density wiring is necessary. In addition, a deficiency of the wiring area is not likely to occur, so that the number of wiring layers of the printed circuit board may be decreased, and as a result thereof, the cost of the printed circuit board and the cost of the system may be reduced.

The present invention is not limited to the embodiments explained above, and includes various variations. Also, the above-explained embodiments are explained in detail in order to explain the present invention to be easily understood, and it is not necessarily limited to the ones equipped with all the explained configurations. Still further, it is possible to substitute a part of the configuration of one embodiment to the configuration of another embodiment. Moreover, it is possible to add a configuration of another embodiment into a configuration of one embodiment. Further, it is possible to add/delete/substitute other configurations, for a part of a configuration of each embodiment. Moreover, only control lines and information lines that are necessary for explanation are shown, and not all the control lines and information lines of a product are necessarily shown. In reality, it is conceivable that almost all the configurations are mutually connected.

REFERENCE SIGNS LIST 1, 2 Printed circuit board
3 Storage system
11a Differential wiring (surface layer)
11b Differential wiring (internal layer)
12 GND layer
13 Through hole (via)
35 Logical board portion
36 HDD control board portion
121a, 121b, 122a, 122b GND conductor pattern
1221, 1222, 1223, 1224, 1225 GND conductor sub pattern

The invention claimed is:

1. A storage system, the storage system comprising:
   a first controller;
   a second controller; and
   a printed circuit board on which a signal line electrically connecting the first controller and the second controller is formed;
   wherein the printed circuit board comprises
   a signal layer on which the signal line is formed;
   a GND layer;
   an insulating layer which is layered on the GND layer; and
   a through hole which connects the signal lines together; and
   wherein a conductor pattern having a predetermined thickness is formed on the GND layer closest to the signal line, away from a connecting portion of the signal line and the through hole, and towards the connecting portion;
   wherein the signal line is a differential signal; and
   wherein the conductor pattern is a stepwise shape with an identical width, which becomes thicker in a stepwise matter towards the connecting portion of the signal line and the through hole.

2. The storage system according to claim 1, the storage system comprising:
   a host communication control unit which provides a storage area constituted from a plurality of memory devices to a host system;
   a memory device control unit which controls the memory device;
   a control unit which controls the overall storage system; and
   a memory device communication control unit which performs communication between the memory device unit and the control unit.

3. The storage system according to claim 2,
   wherein the first controller is the control unit, and the second controller is the host communication control unit or the memory device communication control unit.

4. The storage system according to claim 2,
   wherein the first controller is the memory device communication control unit, and the second controller is the memory device control unit.

5. The storage system according to claim 1,
wherein the conductor pattern is formed between the connection of the signal line and the through hole, and between a connection of the through hole and a signal line different from the signal line, so as to be symmetrical.

6. A printed circuit board, the printed circuit board comprising:
a signal layer on which a signal line is formed;
a GND layer;
an insulating layer which is laminated on the GNS layer; and
a through hole which connects the signal lines together;
wherein a conductor pattern having a predetermined thickness is formed on the GND layer closest to the signal line, away from a connecting portion of the signal line and the through hole, and towards the connecting portion;
wherein the conductor pattern is a stepwise shape with an identical width, which becomes thicker in a stepwise matter towards the connecting portion of the signal line and the through hole.

7. A printed circuit board, the printed circuit board comprising:
a signal layer on which a signal line is formed;
a GND layer;
an insulating layer which is laminated on the GNS layer; and
a through hole which connects the signal lines together;
wherein a conductor pattern having a predetermined thickness is formed on the GND layer closest to the signal line, away from a connecting portion of the signal line and the through hole, and towards the connecting portion;
wherein the conductor pattern is formed between the connection of the signal line and the through hole, and between a connection of the through hole and a signal line different from the signal line, so as to be symmetrical; and
wherein a shape in a horizontal direction of the conductor pattern is a trapezoidal shape with a width which becomes wider towards the connecting portion of the signal line and the through hole, and a shape in a perpendicular direction is a stepwise shape which becomes thicker in a stepwise manner towards the connecting portion of the signal line and the through hole.

8. The printed circuit board according to claim 7, wherein the signal line is a differential signal.

9. A printed circuit board, the printed circuit board comprising:
a signal layer on which a signal line is formed;
a GND layer;
an insulating layer which is laminated on the GNS layer; and
a through hole which connects the signal lines together;
wherein a conductor pattern having a predetermined thickness is formed on the GND layer closest to the signal line, away from a connecting portion of the signal line and the through hole, and towards the connecting portion;
wherein the conductor pattern is formed between the connection of the signal line and the through hole, and between a connection of the through hole and a signal line different from the signal line, so as to be symmetrical; and
wherein the signal line is a differential signal, and the conductor pattern is a stepwise shape with an identical width which becomes thicker in a stepwise manner towards the connecting portion of the signal line and the through hole, and is formed to each of a P-side and a N-side signal line of the differential signal.

* * * * *